(12) United States Patent
Chang et al.

(10) Patent No.: US 8,349,691 B2
(45) Date of Patent: Jan. 8, 2013

(54) METHOD OF FORMING POWER MOSFET

(75) Inventors: Yi-Chi Chang, Hsinchu County (TW);
Chia-Lien Wu, Hsinchu County (TW)

(73) Assignee: Excelliance MOS Corporation,
Hsinchu County (TW)

( * ) Notice: Subject to any disclaimer, the term of this patent is extended or adjusted under 35 U.S.C. 154(b) by 409 days.

(21) Appl. No.: 12/687,845

(22) Filed: Jan. 14, 2010

(65) Prior Publication Data
US 2011/0171799 A1 Jul. 14, 2011

(51) Int. Cl.
*H01L 21/336* (2006.01)
*H01L 29/66* (2006.01)
(52) U.S. Cl. ........................ 438/270; 257/341
(58) Field of Classification Search .................. 438/259, 438/270, 241–244; 257/330, 341, E29.262, 257/E29.318
See application file for complete search history.

(56) References Cited

U.S. PATENT DOCUMENTS
6,511,886 B2    1/2003  Kim et al.
2009/0197380 A1  8/2009  Lee
2010/0072544 A1*  3/2010  Pearse et al. ............ 257/331

OTHER PUBLICATIONS
"First Office Action of China Counterpart Application", issued on Sep. 4, 2012, p1-p10, in which the listed references were cited.

* cited by examiner

*Primary Examiner* — Calvin Lee
(74) *Attorney, Agent, or Firm* — Jianq Chyun IP Office

(57) ABSTRACT

A method of forming a power MOSFET is described. An epitaxial layer of first conductivity type is formed on a substrate of first conductivity type. A body layer of second conductivity type is formed in the epitaxial layer. A plurality of mask patterns are formed on the substrate. A plurality of trenches are formed in the body layer and the epitaxial layer between the mask patterns. An oxide layer is formed on surfaces of the trenches. A conductive layer is formed in the trenches. A trimming process is performed to the mask patterns to reduce the line width of each mask pattern. Two source regions of first conductivity type are formed in the body layer beside each trench by using the trimmed mask patterns as a mask. A plurality of dielectric patterns are formed on the conductive layer and between the trimmed mask patterns. The trimmed mask patterns are removed.

19 Claims, 4 Drawing Sheets

METHOD OF FORMING POWER MOSFET

BACKGROUND OF THE INVENTION

1. Field of the Invention

The invention relates to a method of forming a semiconductor device, and more particularly, to a method of forming a power metal-oxide-semiconductor field effect transistor (MOSFET).

2. Description of Related Art

Power MOSFETs are widely applied to power switching devices, for example, power supplies, converters, or low-voltage motor controller, and the like. In general, a conventional power MOSFET adopts a vertical structural design to enhance the device density. For each power MOSFET, each drain region is formed on the back-side of a chip, and each source region and each gate are formed on the front-side of the chip. The drain regions of the transistors are connected in parallel so as to endure a considerable large current.

As the level of integration of power MOSFETs increases, the dimension of the same is reduced as well. Therefore, misalignments between contact plugs and trenches in power MOSFETs easily occur so as to affect the performance of the device. For example, misalignments between contact plugs and trenches affect the variations of channel on resistance (Ron) and threshold voltage (Vth), and thus, the reduction of the cell pitch is limited.

Moreover, the working loss of power MOSFETs is categorized into a switching loss and a conducting loss. The switching loss caused by input capacitance $C_{iss}$ increases with the increase in operating frequency. The input capacitance $C_{iss}$ includes a gate-to-source capacitance $C_{gs}$ and a gate-to-drain capacitance $C_{gd}$. Thus, one of the most important tasks is to lower the gate-to-drain capacitance $C_{gd}$ for effectively reducing the switching loss.

SUMMARY OF THE INVENTION

Accordingly, the invention is directed to a method of forming a power MOSFET. This method adopts a trimming process and a self-aligned process to prevent misalignments between contact plugs and trenches in the power MOSFET, and manufacture a power MOSFET having a lower gate-to-drain capacitance $C_{gd}$.

The invention is directed to a method of forming a power MOSFET. Firstly, an epitaxial layer of a first conductivity type is formed on a substrate of the first conductivity type. A body layer of a second conductivity type is then formed in the epitaxial layer. Next, a plurality of mask patterns are formed on the substrate. Thereafter, a plurality of trenches are formed in the body layer and in a portion of the epitaxial layer between the mask patterns. A first oxide layer is formed on surfaces of the trenches subsequently. Thereafter, a first conductive layer is formed in the trenches. A trimming process is performed to the mask patterns for reducing a line width of each of the mask patterns. Afterwards, two source regions of the first conductivity type are formed in the body layer beside each trench by using the trimmed mask patterns as a mask. Later, a plurality of dielectric patterns are formed on the first conductive layer and between the trimmed mask patterns. After that, the trimmed mask patterns are removed.

In one embodiment of the invention, after the step of forming the first oxide layer and before the step of forming the first conductive layer, the method further includes forming a second oxide layer on bottoms of the trenches and tops of the mask patterns.

In one embodiment of the invention, a material of the second oxide layer includes an oxide with a dielectric constant smaller than 4.

In one embodiment of the invention, the step of forming the second oxide layer includes the following. Firstly, a mask layer and an oxide material layer are formed on the substrate in sequence. Afterwards, the oxide material layer located on sidewalls of the trenches and the mask patterns is removed by using the mask layer as a stop layer. The mask layer not covered by the second oxide layer is then removed. In addition, a material of the mask layer includes silicon nitride.

In one embodiment of the invention, the step of forming the first conductive layer in the trenches includes the following. First, a conductive material layer is formed on the substrate to fill the trenches. Next, a blanket etching process is performed to the conductive material layer to remove a portion of the conductive material layer. Moreover, the blanket etching process includes a dry etching process. In one embodiment of the invention, surfaces the first conductive layer are no higher than a surface of the body layer.

In one embodiment of the invention, after the step of removing the trimmed mask patterns, a second conductive layer is further formed on the substrate, and the second conductive layer is electrically connected to the source regions. Additionally, a material of the second conductive layer includes aluminum.

In one embodiment of the invention, after the step of removing the trimmed mask patterns and before the step of forming the second conductive layer, a plurality of doped regions of the second conductivity type are formed in the body layer by using the dielectric patterns as a mask, and the second conductive layer is electrically connected to the doped regions.

In one embodiment of the invention, the trimming process includes a wet etching process.

In one embodiment of the invention, the step of forming the dielectric patterns is described as follows. Firstly, a dielectric layer is formed on the substrate to cover the mask patterns. Thereafter, a portion of the dielectric layer is removed until surfaces of the mask patterns are exposed. The step of removing a portion of the dielectric layer also includes performing an etching back process or a chemical mechanical polishing process.

In one embodiment of the invention, a material of the mask patterns include silicon nitride.

In one embodiment of the invention, the mask patterns include a single layer or a multi-layer stacked structure.

In one embodiment of the invention, a material of the first conductive layer includes doped polysilicon.

In one embodiment of the invention, after the step of forming the epitaxial layer and before the step of forming the body layer, a pad oxide layer is further formed on the substrate.

In one embodiment of the invention, the step of forming the first oxide layer includes performing a thermal oxidation process.

In one embodiment of the invention, the first conductivity type is N-type and the second conductivity type is P-type. Alternatively, the first conductivity type is P-type and the second conductivity type is N-type.

In light of the foregoing, the method of the invention adopts a trimming process and a self-aligned process to form the contact plugs of the power MOSFETs with the mask patterns that form the trenches. Thus, misalignments do not occur between the contact plugs and the trenches. The cell pitch is therefore greatly reduced to enhance the level of integration of the device. Furthermore, the method of the invention is simple and does not require additional photomasks. The formation of the source regions, the doped regions, and the contact plugs can be completed by using the self-aligned process, such that the production cost is significantly reduced and the competitive advantage is achieved. Moreover, the gate oxide layer (that is, the first oxide layer) of the invention is formed by a single thermal oxidation process. Consequently, deterioration of the device performance caused by discontinuous interface of a conventional gate oxide layer does not occur. The bottom oxide layer (that is, the second oxide layer) foamed on the bottoms of the trenches is made of an oxide with a dielectric constant smaller than 4. The gate-to-drain capacitance $C_{gd}$ can thus be lowered to effectively reduce the switching loss.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A through 1H are cross-sectional views schematically depicting a method of forming a power MOSFET according to an embodiment of the invention.

Figure 1A:
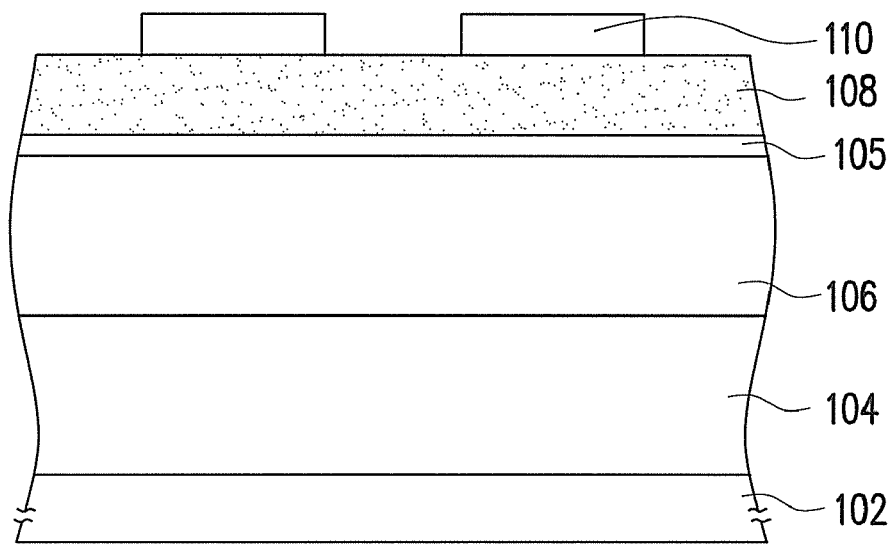
FIGS. 1A through 1H are cross-sectional views schematically depicting a method of forming a power MOSFET according to an embodiment of the invention.

Referring to FIG. 1A, an epitaxial layer 104 of a first conductivity type is formed on a substrate 102 of the first conductivity type. Here, the substrate 102 of the first conductivity type serves as a drain. The substrate 102 is, for example, an N-type heavily-doped silicon substrate. The epitaxial layer 104 is, for example, an N-type lightly-doped epitaxial layer, and the formation method thereof includes performing a selective epitaxy growth (SEG) process. A body layer 106 of a second conductivity type is then formed in the epitaxial layer 104. The body layer 106 is, for example, a P-type body layer, and the formation method thereof includes performing an ion implantation process and a subsequent drive-in process. In one embodiment of the invention, after the step of forming the epitaxial layer 104 and before the step of forming the body layer 106, a pad oxide layer 105 is optionally formed on the substrate 102. The pad oxide layer 105 prevents a tunneling effect that results from the ion implantation process for forming the body layer 106. The material of the pad oxide layer 105 includes silicon oxide, and the pad oxide layer 105 is formed by performing a thermal oxidation process, for example.

Afterwards, a mask layer 108 and a patterned photoresist layer 110 are sequentially formed on the substrate 102. The material of the mask layer 108 includes silicon nitride, and the mask layer 108 is formed by performing a chemical vapor deposition (CVD) process, for example. In one embodiment, the mask layer 108 is a single silicon nitride layer having a thickness of about, for example, 5000 Å~6000 Å, as shown in FIG. 1. In another embodiment (not shown), the mask layer 108 can also be a multi-layer stacked structure, for example, a double-layer stacked structure including a bottom silicon nitride layer and a top silicon oxide layer, depending on the process requirements.

Figure 1B:
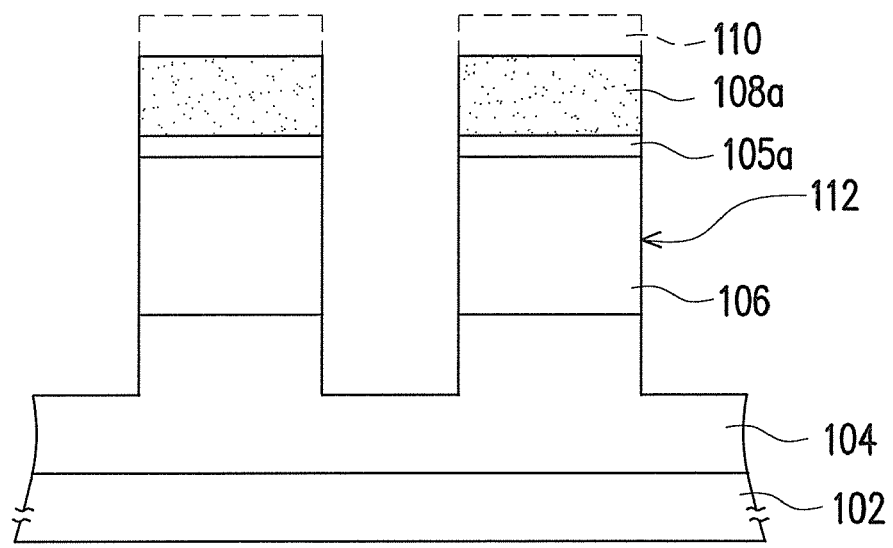

Referring to FIG. 1B, the mask layer 108 and the pad oxide layer 105 are sequentially patterned by using the patterned photoresist layer 110 as a mask, so as to form pad oxide patterns 105a and mask patterns 108 on the substrate 102. Subsequently, the patterned photoresist layer 110 is removed. A dry etching process is performed by using the mask patterns 108a as a mask, so as to form a plurality of trenches 112 in the body layer 106 and in a portion of the epitaxial layer 104 between the mask patterns 108a. In one embodiment, after the step of forming the trenches 112, an isotropic etching process is optionally performed to surfaces of the trenches 112 to remove surface damages of the trenches 112. Afterwards, a sacrificial oxide layer (not shown) is optionally formed on the substrate 102 and subsequently removed to repair the damaged crystal lattices on the surfaces of the trenches 112. It should be noted that when the mask layer 108 is a double-layer stacked structure including a bottom silicon nitride layer and a top silicon oxide layer, the top silicon oxide layer is removed during the step of removing the sacrificial oxide layer.

Figure 1C:
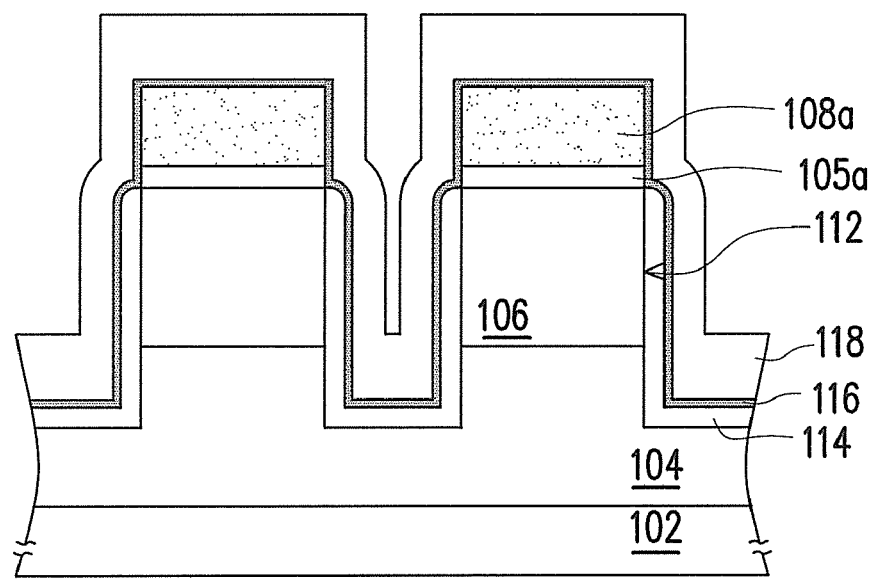

Referring to FIG. 1C, an oxide layer 114 is formed on the surfaces of the trenches 112. The material of the oxide layer 114 includes silicon oxide, and the oxide layer 114 is formed by performing a thermal oxidation process, for example. The oxide layer 114 has a thickness of about 100 Å~1000 Å, for example. In one embodiment, the oxide layer 114 has a thickness of about 500 Å. A mask layer 116 and an oxide material layer 118 are sequentially formed on the substrate 102. The method of forming the mask layer 116 and the oxide material layer 118 includes performing a CVD process. The mask layer 116 is, for example, a silicon nitride layer having a thickness of about 200 Å. The material of the oxide material layer 118 includes an oxide with a dielectric constant smaller than 4. The oxide material layer 118 is, for example, a silicon oxide layer having a thickness of about 4000 Å. However, due to the limitation in the CVD process, the oxide material layer 118 have a greater thickness on tops of the mask patterns 108a and bottoms of the trenches 112 than on sidewalls of the trenches 112 and the mask patterns 108a. In one embodiment, the thickness of the oxide material layer 118 on the tops of the mask patterns 108a and the bottoms of the trenches 112 is about 4000 Å; however, the thickness of the same on the sidewalls of the trenches 112 and the mask patterns 108a is about 2000 Å.

Figure 1D:
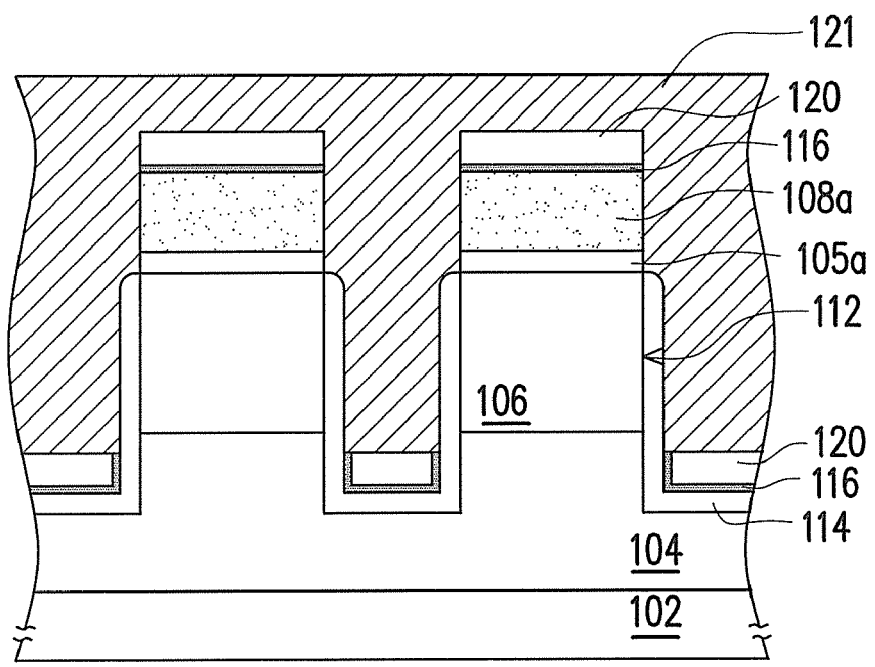

Referring to FIG. 1D, a blanket etching process is performed by using the mask layer 116 as a stop layer, so as to remove the oxide material layer 118 located on the sidewalls of the trenches 112 and the mask patterns 108a, and leave an oxide layer 120 located on the tops of the mask patterns 108a and the bottoms of the trenches 112. In one embodiment, the oxide layer 120 has a thickness of about 2000 Å. The blanket etching process is a wet etching process, and an etching solution used is, for example, a buffer oxide etchant (BOE) or a diluted hydrofluoric acid (DHF). The mask layer 116 not covered by the oxide layer 120 is then removed. The mask layer 116 not covered by the oxide layer 120 is removed by performing a wet etching process, and the etching solution used is phosphoric acid ($H_3PO_4$), for example. It should be noted that the purpose of forming the oxide layer 120 on the bottoms of the trenches 112 is to lower the gate-to-drain capacitance $C_{gd}$ so as to effectively reduce the switching loss. Without considering the gate-to-drain capacitance $C_{gd}$, the formation of the oxide layer 120 on the bottoms of the trenches 112 can be omitted. That is, the following steps can be omitted: the step of forming the mask layer 116 and the oxide material layer 118, the step of removing a portion of the oxide material layer 118 to form the oxide layer 120, and the step of removing the mask layer 116 not covered by the oxide layer 120.

Figure 1E:
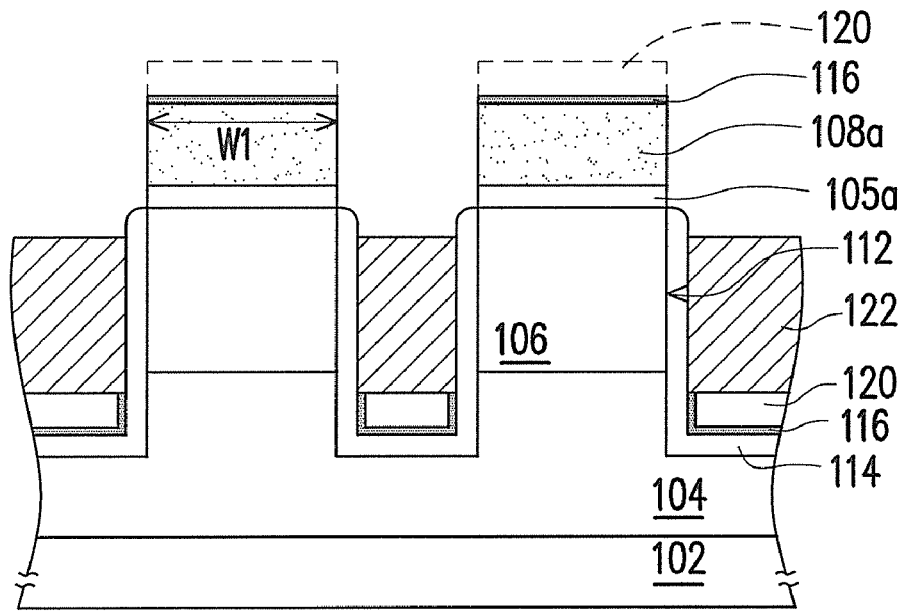

Referring to FIG. 1E, a conductive layer 122 is then formed in the trenches 112. The step of forming the conductive layer 122 includes forming a conductive material layer 121 (as shown in FIG. 1D) on the substrate 102 filling the trenches 112. The material of the conductive material layer 121 is, for example, doped polysilicon. Next, a blanket etching process is performed to the conductive material layer 121 to remove a portion of the conductive material layer 121. In one embodiment, the blanket etching process is, for example, a dry etching process by using the oxide layer 120 as a stop layer, as shown in FIG. 1E. In another embodiment, when the oxide layer 120 is not formed, the blanket etching process is, for example, a dry etching process which uses a time mode to determine the etching endpoint. In one embodiment, after the step of forming the conductive layer 122, a thermal oxidation process is optionally performed to the conductive layer 122 to enhance the withstand voltage level of the conductive layer 122. In addition, the surface of the conductive layer 122 is no higher than that of the body layer 106. That is, the surface of the conductive layer 122 substantially equals to or is lower than that of the body layer 106. The oxide layer 120 on the mask patterns 108a is then removed.

Figure 1F:
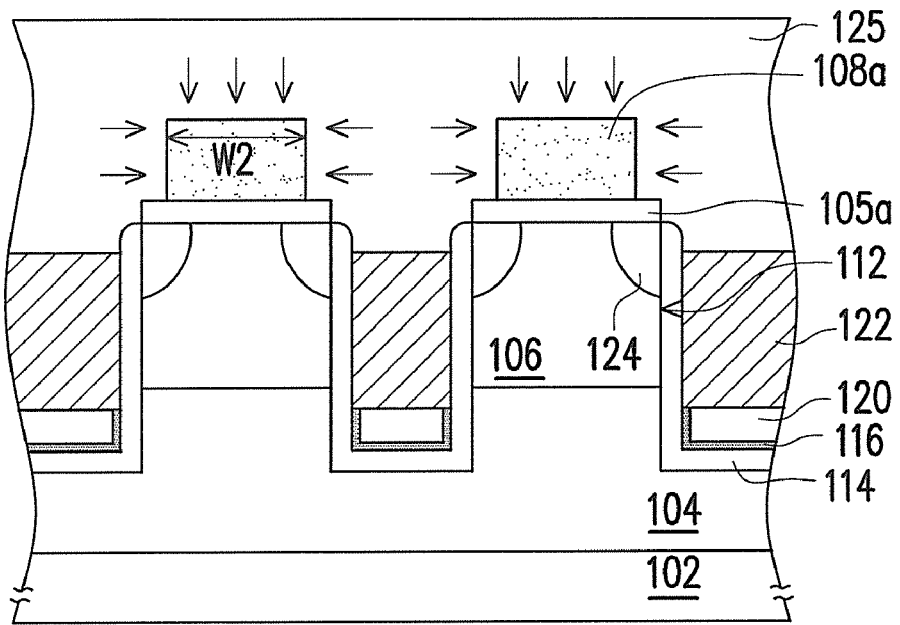

Referring to FIG. 1F, a trimming process is performed to the mask patterns 108a for reducing the line width of each of the mask patterns 108a. The line width of the mask patterns 108a is reduced from W1 (as shown in FIG. 1E) to W2 (as shown in FIG. 1F). The trimming process is a wet etching process, and an etching solution used is phosphoric acid, for example. In one embodiment, since the mask patterns 108a and the mask layer 116 are all made of silicon nitride, the mask layer 116 located on the mask patterns 108a is simultaneously removed during the step of trimming the mask patterns 108a. Afterwards, two source regions 124 of the first conductivity type are formed in the body layer 106 beside each trench 112 by using the trimmed mask patterns 108a as a mask. The source regions 124 are, for example, N-type heavily-doped doped regions. The N-type dopant is, for example, phosphorous (P) or arsenic (As). The step of foaming the source regions 124 includes performing an ion implantation process and a subsequent drive-in process; thus, a portion of the formed source region 124 extends beneath the mask patterns 108a. The ion implantation process for forming the source regions 124 adopts the trimmed mask patterns 108a as a mask, and is thus a self-aligned process.

Figure 1G:
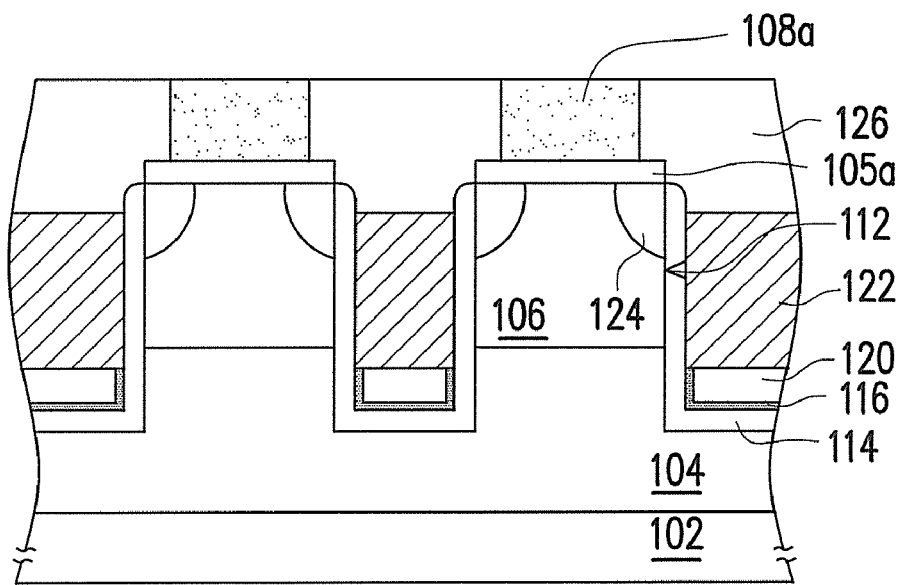

Referring to FIG. 1G, a plurality of dielectric patterns 126 are formed on the conductive layer 122 and between the trimmed mask patterns 108a. The step of forming the dielectric patterns 126 includes forming a dielectric layer 125 (as shown in FIG. 1F) on the substrate 102 covering the trimmed mask patterns 108a. The material of the dielectric layer 125 includes silicon oxide, borophosphosilicate glass (BPSG), phosphosilicate glass (PSG), fluorosilicate glass (FSG), or undoped silicon glass (USG), for example. The dielectric layer 125 is formed by performing a CVD process, for example. Thereafter, a portion of the dielectric layer 125 is removed until surfaces of the trimmed mask patterns 108a are exposed. The method of removing the portion of the dielectric layer 125 includes performing an etching back process or a chemical mechanical polishing (CMP) process. It should be noted that in this step, the dielectric patterns 126 and the mask patterns 108a are substantially complementary patterns to each other.

Figure 1H:
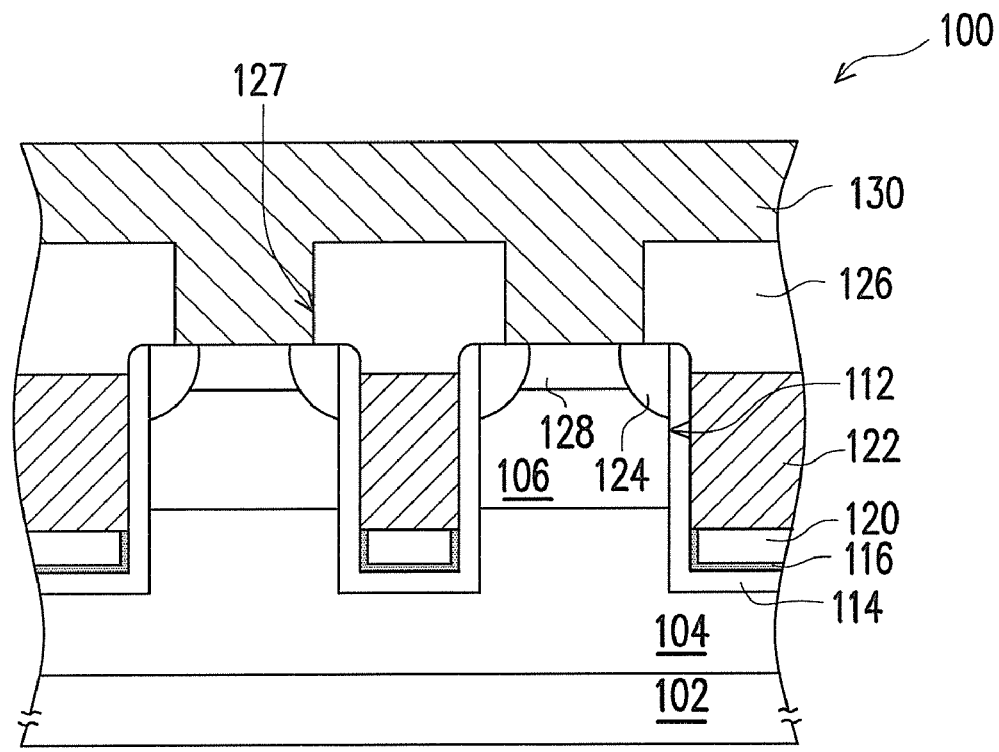

Referring to FIG. 1H, the trimmed mask patterns 108a are removed. Subsequently, the pad oxide patterns 105a are removed to form contact holes 127 between the dielectric patterns 126. The method of removing the pad oxide patterns 105a is a wet etching process, and an etching solution used is, for example, a BOE or a DHF. In one embodiment, a portion of the dielectric patterns 126 is simultaneously removed during the step of removing the pad oxide patterns 105a. Next, a plurality of doped regions 128 of the second conductivity type is formed in the body layer 106 by using the dielectric patterns 126 as a mask. The doped regions 128 are formed to reduce the resistance between the subsequently formed contact plugs and the body layer 106. The doped regions 128 are the P-type heavily-doped doped regions, for example. The P-type dopant is, for example, boron (B). The ion implantation process for forming the doped regions 128 adopts the dielectric patterns 126 as a mask and is thus a self-aligned process. A conductive layer 130 is then formed on the substrate 102. The conductive layer 130 is electrically connected to the source regions 124 and the doped regions 128. The material of the conductive layer 130 includes aluminum, and the conductive layer 130 is formed by performing a CVD process, for example. Up to this point, the formation of a power MOSFET 100 of the invention is completed.

In the embodiments illustrated, the first conductive type is N-type and the second conductive type is P-type. However, the invention is not limited thereto. People skilled in the art should understand that the first conductive type can also be P-type while the second conductive type is N-type.

In summary, the method of foaming the power MOSFET 100 of the invention includes performing a trimming process to the mask patterns 108a that form the trenches 112, so as to reduce the line width of the trenches 112. Afterwards, two source regions 124 are formed in the body layer 106 beside each trench 112 by using the trimmed mask patterns 108a as a mask. The complementary patterns (that is, the dielectric patterns 126) of the trimmed mask patterns 108a are formed. Later, the trimmed mask patterns 108a are removed to form contact holes 127, such that the subsequently formed conductive layer 130 is electrically connected to the source regions 124.

That is, the method of the invention adopts the trimming process and the self-aligned process to form the contact plugs of the power MOSFET 100. Thus, misalignments do not occur between the contact plugs and the trenches 112. Therefore, the cell pitch can be minimized. In other words, the trench-to-trench distance can be reduced to the limit (that is, the photolithographic resolution) of a photolithographic station. Moreover, the trimming process and the self-aligned process are performed to form the contact plugs with the mask patterns 108a that form the trenches 112. The cell pitch can then be reduced greatly to enhance the level of integration of the device.

Furthermore, the method of the invention is simple and does not require additional photomasks. The formation of the source regions 124, the doped regions 128, and the contact plugs can be completed by using the self-aligned process, such that the production cost is significantly reduced and the competitive advantage is achieved.

The gate oxide layer (that is, the oxide layer 114) of the invention is formed by a single thermal oxidation process. Consequently, deterioration of the device performance caused by discontinuous interface of a conventional gate oxide layer does not occur.

The bottom oxide layer (that is, the second oxide layer 120) foamed on the bottoms of the trenches is made of an oxide with a dielectric constant smaller than 4. The gate-to-drain capacitance $C_{gd}$ can thus be lowered to effectively reduce the switching loss.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of forming a power metal-oxide-semiconductor field effect transistor (MOSFET), comprising:
    forming an epitaxial layer of a first conductivity type on a substrate of the first conductivity type;
    forming a body layer of a second conductivity type in the epitaxial layer;
    forming a plurality of mask patterns on the substrate;
    forming a plurality of trenches in the body layer and in a portion of the epitaxial layer between the mask patterns;
    forming a first oxide layer on surfaces of the trenches;
    forming a first conductive layer in the trenches;
    performing a trimming process to the mask patterns for reducing a line width of each of the mask patterns, so as to form trimmed mask patterns;
    forming two source regions of the first conductivity type in the body layer beside each of the trenches by using the trimmed mask patterns as a mask;
    forming a plurality of dielectric patterns on the first conductive layer and between the trimmed mask patterns; and
    removing the trimmed mask patterns, wherein a surface of the first conductive layer is no higher than a surface of the body layer.

2. The method of forming the power MOSFET as claimed in claim 1, further comprising, after the step of forming the first oxide layer and before the step of forming the first conductive layer, forming a second oxide layer on bottoms of the trenches and tops of the mask patterns.

3. The method of foaming the power MOSFET as claimed in claim 2, wherein a material of the second oxide layer comprises an oxide with a dielectric constant smaller than 4.

4. The method of forming the power MOSFET as claimed in claim 2, wherein the step of forming the second oxide layer comprises:
    sequentially forming a mask layer and an oxide material layer on the substrate;
    removing the oxide material layer located on sidewalls of the trenches and the mask patterns by using the mask layer as a stop layer; and
    removing the mask layer not covered by the second oxide layer.

5. The method of forming the power MOSFET as claimed in claim 4, wherein a material of the mask layer comprises silicon nitride.

6. The method of forming the power MOSFET as claimed in claim 1, wherein the step of forming the first conductive layer in the trenches comprises:
    forming a conductive material layer on the substrate filling the trenches; and
    performing a blanket etching process to the conductive material layer to remove a portion of the conductive material layer.

7. The method of forming the power MOSFET as claimed in claim 6, wherein the blanket etching process comprises a dry etching process.

8. The method of forming the power MOSFET as claimed in claim 1, further comprising, after the step of removing the trimmed mask patterns, forming a second conductive layer on the substrate, and the second conductive layer being electrically connected to the source regions.

9. The method of forming the power MOSFET as claimed in claim 8, wherein a material of the second conductive layer comprises aluminum.

10. The method of forming the power MOSFET as claimed in claim 8, further comprising, after the step of removing the trimmed mask patterns and before the step of forming the second conductive layer, forming a plurality of doped regions of the second conductivity type in the body layer by using the dielectric patterns as a mask, and the second conductive layer being electrically connected to the doped regions.

11. The method of forming the power MOSFET as claimed in claim 1, wherein the trimming process comprises a wet etching process.

12. The method of forming the power MOSFET as claimed in claim 1, wherein the step of forming the dielectric patterns comprises:
    forming a dielectric layer on the substrate covering the mask patterns; and
    removing a portion of the dielectric layer until surfaces of the mask patterns are exposed.

13. The method of forming the power MOSFET as claimed in claim 12, wherein the step of removing the portion of the dielectric layer comprises performing an etching back process or a chemical mechanical polishing process.

14. The method of forming the power MOSFET as claimed in claim 1, wherein a material of the mask patterns comprises silicon nitride.

15. The method of forming the power MOSFET as claimed in claim 1, wherein each of the mask patterns comprises a single layer or a multi-layer stacked structure.

16. The method of forming the power MOSFET as claimed in claim 1, wherein a material of the first conductive layer comprises doped polysilicon.

17. The method of forming the power MOSFET as claimed in claim 1, further comprising, after the step of forming the epitaxial layer and before the step of forming the body layer, forming a pad oxide layer on the substrate.

18. The method of forming the power MOSFET as claimed in claim 1, wherein the step of forming the first oxide layer comprises performing a thermal oxidation process.

19. The method of forming the power MOSFET as claimed in claim 1, wherein the first conductivity type is N-type while the second conductivity type is P-type, or the first conductivity type is P-type while the second conductivity type is N-type.

* * * * *